United States Patent [19]

Lang et al.

[11] Patent Number: 4,572,729

[45] Date of Patent: Feb. 25, 1986

[54] METHOD FOR PRODUCING ARTICLES OF HIGH-PURITY SYNTHETIC QUARTZ GLASS

[75] Inventors: Winfried Lang, Ach, Austria; Rudolf Griesshammer, Altötting, Fed. Rep. of Germany; Michael Schwab, Neuötting, Fed. Rep. of Germany; Werner Zulehner, Haiming, Fed. Rep. of Germany

[73] Assignee: Wacker-Chemitronic Gesellschaft fur Elektronik-Grundstoffe mbH, Burghausen, Fed. Rep. of Germany

[21] Appl. No.: 567,086

[22] Filed: Dec. 30, 1983

[30] Foreign Application Priority Data

Jan. 27, 1983 [DE] Fed. Rep. of Germany ....... 3302745

[51] Int. Cl.$^4$ .................. C03B 19/06; C03B 20/00
[52] U.S. Cl. ................ 65/18.1; 65/DIG. 8; 264/56
[58] Field of Search .......... 65/17, 18.1, 18.2, DIG. 8; 264/65, 56; 501/12, 53, 54

[56] References Cited

U.S. PATENT DOCUMENTS

| | | | |
|---|---|---|---|
| 2,268,589 | 1/1942 | Heany | 65/18.1 |
| 4,381,931 | 5/1983 | Hunold et al. | 54/18.1 |
| 4,414,012 | 11/1983 | Suto et al. | 65/18.2 |

FOREIGN PATENT DOCUMENTS

| | | | |
|---|---|---|---|
| 55-167143 | 12/1980 | Japan | 65/18.1 |
| 56-09230 | 1/1981 | Japan | 65/18.2 |
| 56-09232 | 1/1981 | Japan | 65/18.2 |
| 56-37234 | 4/1981 | Japan | 65/18.1 |
| 56-32344 | 4/1981 | Japan | 65/18.2 |
| 56-100145 | 8/1981 | Japan | 501/12 |
| 56-129621 | 10/1981 | Japan | 65/18.1 |

*Primary Examiner*—Kenneth M. Schor
*Attorney, Agent, or Firm*—Collard, Roe & Galgano

[57] ABSTRACT

A method is described according to which articles of quartz glass, particularly quartz crucibles for use in crucible pulling according to Czochralski of high-purity synthetic quartz glass can be produced. High-purity silicon tetrachloride is hydrolized with water. The hydrolysis product is separated, dried, shaped, sintered and superficially fused.

3 Claims, No Drawings

METHOD FOR PRODUCING ARTICLES OF HIGH-PURITY SYNTHETIC QUARTZ GLASS

BACKGROUND OF THE INVENTION

The invention relates to a method for producing articles of high-purity synthetic quartz glass, especially quartz crucibles for use in the crucible pulling of silicon crystals according to Czochralski.

High quality quartz glass is an indispensible material in semiconductor technology in producing and processing materials such as germanium, indium phosphide, gallium arsenide and particularly silicon, because of its purity, temperature stability and chemical resistance. Thus, for instance, the precipitation of very high-purity polycrystalline silicon by decomposition of trichlorosilane on heated substrates is often carried out in quartz bells (see, for instance, DE-AS No. 31 07 421). Also for high-temperature processes, such as oxidation, to which silicon wafers are subjected in the course of being processed into semiconductor components, reaction chambers of quartz glass have proven themselves.

The highest requirements are demanded of quartz glass if used as the melting crucible material in the crucible pulling of silicon crystals according to Czochralski. Because of the direct contact between the aggressive silicon melt and the wall of the quartz crucible, the danger of contamination of the melt and of softening of the crucible wall is particularly great. For this reason, the resistance of the pulled silicon crystals can be increased only to a certain limit if quartz crucibles are used which are made of natural quartz, i.e., quartz crystals or quartz sand because of the large content of the doping substances boron, phosphorus and aluminum in the crucible material. Crystals with higher resistance, on the other hand, must be made by the more expensive float-zone-pulling method. Crucibles of natural quartz are therefore coated with the purer synthetic quartz according to DE-AS No. 29 28 089. However, the coating process must be carried out in a cumbersome manner under continuous rotation of the workpiece. There is the further danger that parts of the synthetic inner coating may burst off the outer wall of natural quartz.

SUMMARY OF THE INVENTION

It is therefore an object of the invention to provide a method which simplifies the production of articles of high-purity synthetic quartz glass.

This object is attained according to the invention by a method which is characterized by the following steps:
(a) hydrolysis of high-purity silicon tetrachloride with high-purity water;
(b) separation and drying of the hydrolysis product;
(c) shaping of the dried product;
(d) sintering of the shaped product; and
(e) superficial fusing of the sintered product.

In principle, this method is suitable for manufacturing the most varied articles of high-purity synthetic quartz glass, for instance, reaction tubes, quartz bells, quartz boats or the like. In particular, however, quartz crucibles are produced, preferably for use in crucible pulling of silicon crystals according to Czochralski. By means of such high-purity crucibles, resistance values can also be obtained in crucible-pulled single crystals which could otherwise only be achieved by float-zone pulling. Thereby, crystals with diameters and an oxygen content made possible only by the crucible pulling method, but which have resistance values corresponding to zone-pulled material, can be produced in a cost-effective manner. Such an increased oxygen content cannot be achieved in zone-pulled silicon crystals even though it is required for many applications, for instance, because of its gettering action.

DESCRIPTION OF THE PREFERRED EMBODIMENT

Turning now in detail to the method embodying the present invention, high-purity silicon tetrachloride and high-purity water serve as the starting point. For both substances, a multiplicity of different production possibilities is known. Silicon tetrachloride is obtained, e.g., advantageously in the production of polycrystalline silicon by decomposition of trichlorosilane as a by-product in large quantities with very high purity. Water can, e.g., be brought to a suitable degree of purity by desalination and reverse osmosis. In principle, an approximately equal degree of purity should be present in both components.

The hydrolysis can be carried out in the temperature range from room temperature to boiling temperature. The silicon tetrachloride can be introduced expediently in liquid form into an excess of water. Preferably, however, water is added to an excess of liquid silicon tetrachloride because then, and end product is obtained that has a particularly low content of OH groups and is distinguished by surprisingly high softening resistance at high temperatures. This property is often poorly developed in customary synthetic quartz glasses (see in this connection, for instance, *Encyclopedia of Chemical Technology, Vol.* 18, pages 85 and 86 (1969), Second Edition, John Wiley and Sons, Inc.).

The hydrolysis reaction is advantageously carried out in a protective gas, e.g., nitrogen or argon. It is also advantageous to stir the reaction mixture, for instance, by means of a vane stirrer. As reaction vessels suitable for reasons of purity, are especially vessels of quartz glass or polytetrafluoroethylene (Teflon).

After the hydrolysis reaction is completed, the hydrolysis product is separated from the remaining liquid phase, e.g., by filtration or centrifuging. In addition, particularly for products which were obtained by the addition of water, preferably in a deficiency to the silicon tetrachloride presented, also evaporation by mere heating, optionally in a vacuum, can be considered. A temperature range of 100° to 200° C. has been found suitable for this purpose. By a further increase of the temperature to about 800° to 1000° C., the powdered raw product obtained can then be dried further, preferably until approximate weight constancy is achieved.

The thus pre-treated raw product is subsequently subjected to a shaping step, for instance, by molding it into the desired shape. As a rule, the product obtained by the shaping step has already a strength such that it can be taken from the mold for further processing. The blank which then has already substantially the final form, is subsequently sintered for further strengthening at temperatures of 1100° to 1300° C. This can be done, for instance, in the known ovens customary for sintering operations. Isostatic hot-pressing has been found to be a particularly advantageous shaping method, particularly at temperatures of about 800° to about 1200° C. and pressures of 500 to 2500 bar, since here, the shaping and sintering steps are combined in one operation. However, isostatic hot-pressing can optionally also be followed by an additional sintering process.

In the last process step, the sintered article is finally fused superficially and specifically, as a rule, at least at that surface which is subjected to special stresses with respect, for instance, to resistivity, chemical stability, density and the like. In the case of quartz crucibles this is generally the inside wall. The fusing is advantageously accomplished by the action of a hydrogen-oxygen flame, although in principle other heat sources such as arc heaters, are also suitable for this purpose. In general, it is sufficient if the fused layer has a thickness of about 20 to 40% of the total wall thickness.

By the method according to the invention, crucibles for use in the crucible pulling process according to Czochralski can be made to particular advantage. The advantage is, on the one hand, the purity of the crucible material which is higher than natural quartz. On the other hand, such crucibles also have high heat stability, since the synthetic quartz glass according to the invention is surprisingly superior to conventional synthetic material as far as softening resistance is concerned.

In the following, the invention will be more fully described in an example. It should, however, be understood limitation.

EXAMPLE

Into a 2-liter Teflon flask, 1000 ml of silicon tetrachloride produced in the silicon preparation process by decomposition of trichlorosilane are introduced at room temperature and reacted gradually with 250 ml of water purified by reverse osmosis, corresponding to about 20% less than the stoichiometrically required amount, while flushing with nitrogen and simultaneous vigorous stirring. In the course of the reaction, the mixture heats up to the boiling temperature of the silicon tetrachloride. After the end of the water addition and completion of the reaction, the temperature is raised to 150° C. in order to free the $SiO_2$ powder produced of adhering silicon tetrachloride. In this manner, 450 g of x-ray amorphous raw $SiO_2$ are obtained; by gradual heating to 950° C., the product loses another 50 g in weight. With the remaining powder, a crucible form is filled and a crucible blank (diameter about 120 mm, height about 110 mm, wall thickness about 4 mm) is prepared by isostatic hot-pressing at 900° C. and 1000 bar. This blank is additionally sintered for 2 hours at 1200° C. and, finally, fused at its inside surface to 30% of the total wall thickness in a hydrogen-oxygen flame.

From the crucible so obtained, a silicon single crystal of 54 mm diameter and 30 cm length is pulled by crucible pulling according to Czochralski. The doping substance concentrations determined at the end of the rod by low-temperature IR measurements are $5 \times 10^{12}$ atoms/cm$^3$ P and $6 \times 10^{12}$ atoms/cm$^3$ B; the aluminum content is below the detection limit.

After the pulling process is completed, sticking or adhesion of the quartz crucible to the surrounding graphite crucible cannot be found.

From such crucibles, silicon single crystals can be pulled, the doping substance content of which correspond to zone-pulled material and the oxygen content of which correspond to crucible-pulled material.

While only one embodiment and example of the present invention have been described, it is obvious that many changes and modifications may be made thereunto, without departing from the spirit and scope of the invention.

What is claimed is:

1. A method for producing articles of high-purity synthetic quartz, comprising the steps of:
   (a) hydrolyzing liquid silicon tetrachloride with water in a liquid phase hydrolysis reaction by adding said water to an excess amount of said silicon tetrachloride so as to produce a hydrolysis product, said liquid silicon tetrachloride having a purity at least equivalent to the purity of silicon tetrachloride as obtained as a by-product in the production of polycrystalline silicon by decomposition of trichlorosilane and said water having a purity of approximately equal degree to that of said liquid silicon tetrachloride;
   (b) separating and drying the hydrolysis product;
   (c) shaping the dried hydrolysis product to form an article having at least one inside wall;
   (d) sintering said article; and
   (e) superficially fusing said sintered article so that said inside wall thereofd has a quartz fused surface layer which has a thickness of about from 20–40% of the total wall thickness.

2. The method of claim 1, wherein silicon tetrachloride produced in the preparation of silicon by decomposition of trichlorosilane is that which is hydrolyzed in step (a).

3. The method of claim 1, wherein steps (c) and (d) are performed by isostatic hot-pressing.

* * * * *